United States Patent [19]

Blauvelt et al.

[11] Patent Number: 5,127,072
[45] Date of Patent: Jun. 30, 1992

[54] LASER MODULE WITH COMPLIANT OPTICAL FIBER COUPLING

[75] Inventors: Henry A. Blauvelt, Los Angeles; Sze-Keung Kwong, Los Alamitos; Ching-Jong Lii, Monrovia; Ronald S. Moeller, Stevenson Ranch; Israel Ury, Los Angeles, all of Calif.

[73] Assignee: Ortel Corporation, Alhambra, Calif.

[21] Appl. No.: 490,483

[22] Filed: Mar. 8, 1990

[51] Int. Cl.⁵ .......................... G02B 6/00; G02B 6/36
[52] U.S. Cl. ....................................... 385/88; 372/38
[58] Field of Search ............... 350/96.18, 96.20-96.22; 372/36, 38

[56] References Cited

U.S. PATENT DOCUMENTS

| 4,802,178 | 1/1989 | Ury | 372/38 X |
| 5,002,357 | 3/1991 | Newell | 350/96.20 |

Primary Examiner—Akm E. Ullah
Attorney, Agent, or Firm—Christie, Parker & Hale

[57] ABSTRACT

A small module for converting an electrical signal to a modulated light signal on an optical fiber comprises a housing, a laser mounted on a laser substrate within the housing, a GRIN lens and an optical isolator downstream from the laser, and a precision capillary for holding an optical fiber downstream from the optical isolator. The relative positions of the laser, lens, optical isolator and fiber are adjusted to maximize light output through the fiber. The optical fiber is sealed to the housing at one point and is free to move axially in the capillary for minimizing mechanical stress on the fiber.

24 Claims, 3 Drawing Sheets

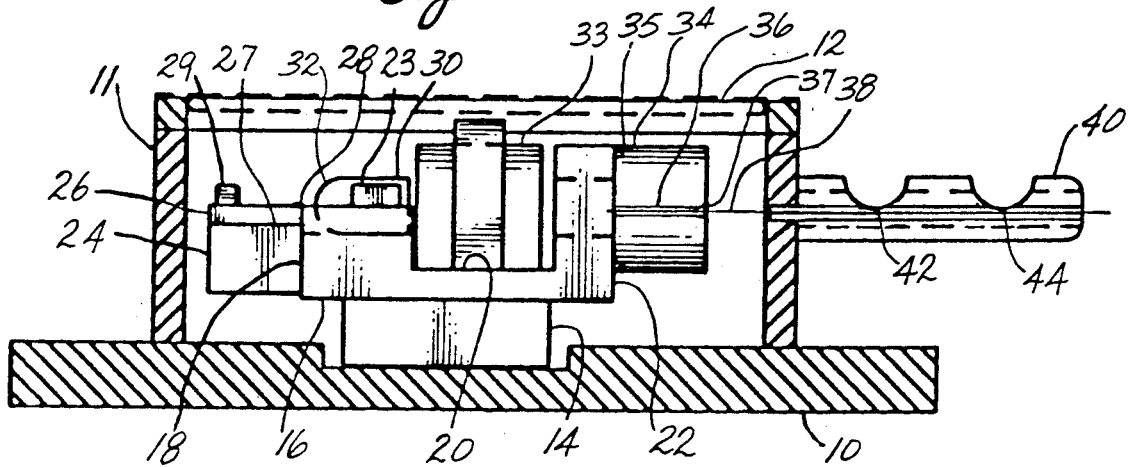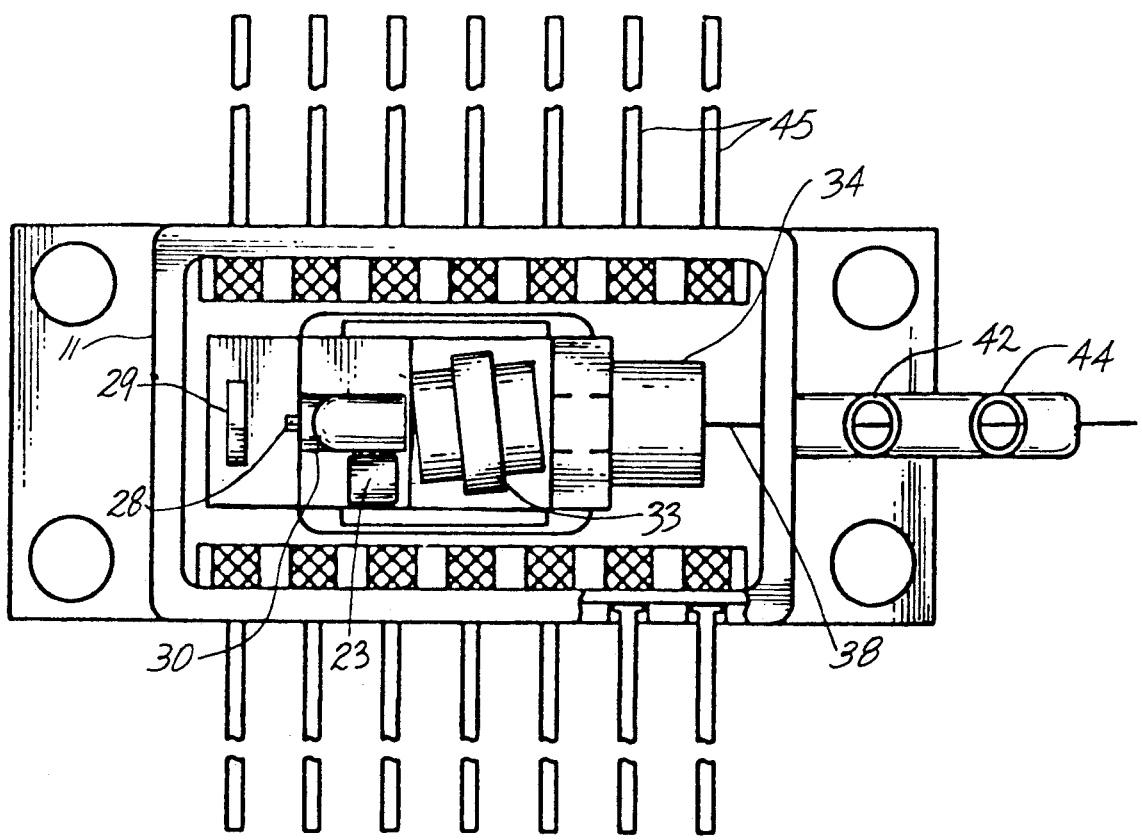

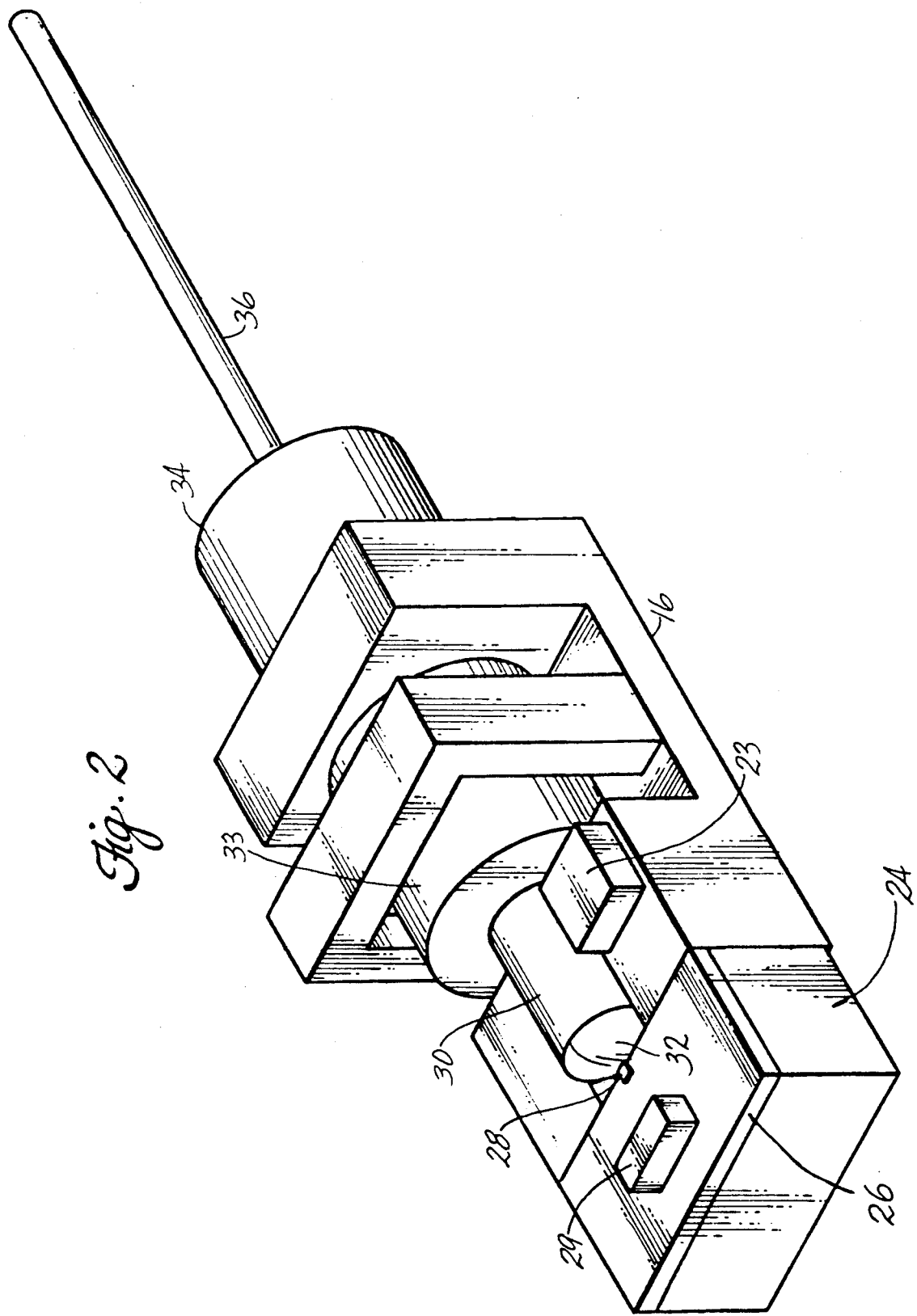

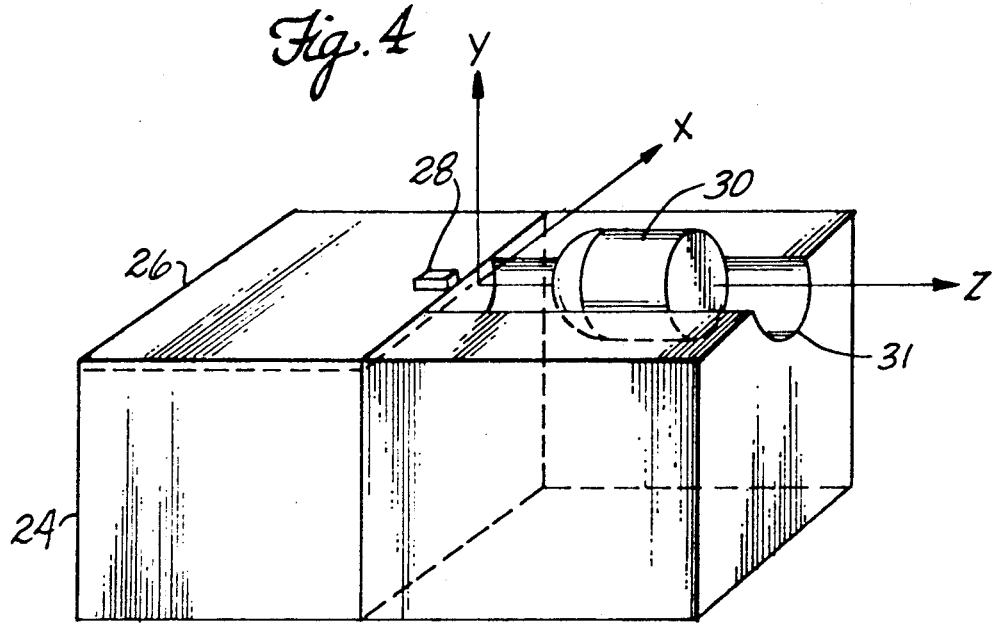
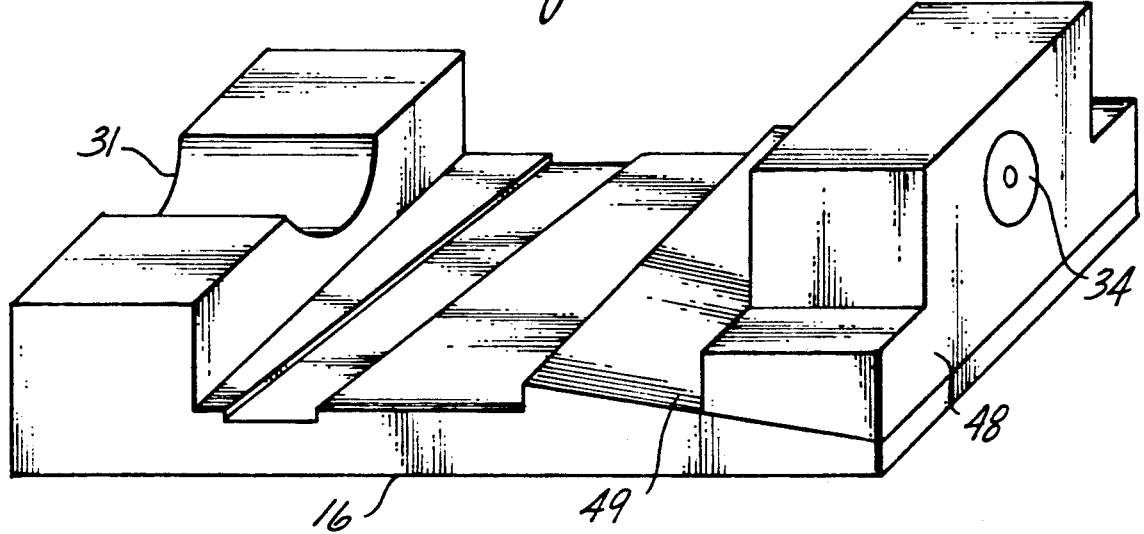

LASER MODULE WITH COMPLIANT OPTICAL FIBER COUPLING

FIELD OF THE INVENTION

This invention relates to a miniature module for converting an electrical signal into an optical signal on an optical fiber, and a method of aligning the fiber with the components of the module.

BACKGROUND OF THE INVENTION

Devices for converting electrical signals into optical signals are known. Semiconductor laser diodes are quite useful for converting electrical signals to a modulated light beam as they can be modulated at extremely high rates. In a high speed fiber optic laser module, an electrical input signal is converted into an optical output signal via a laser diode, and the output is then transmitted via the optical fiber. An example of such a module is described in U.S. Pat. No. 4,802,178 to Ury (incorporated by reference herein).

Alignment of the optical fiber with the laser diode in fiber optic modules is a critical, but often difficult task, in part because of the extremely small size of the laser and the optical fiber. Temperature changes compound the problem, as thermal stresses can build up between the optical fiber and other parts of the module and force the fiber out of alignment. Additionally, the noise in the modulated signal of the laser is increased by light which gets reflected back toward the laser, including reflections from the end of the optical fiber. Accordingly, there is a need for a laser modulation device which is easy to align and maintain in an aligned configuration. Such a device should reduce or relieve the build-up of thermal stress on an attached optical fiber and should reduce noise of the laser diode without the device. Preferably, the device should be capable of manufacture with or without the optical fiber that is ultimately used for the transmission of output signals, so that the customer of the device may install his own fiber.

BRIEF SUMMARY OF THE INVENTION

There is, therefore, provided in an exemplary embodiment of the present invention a laser module in a sealed housing. An optical bench is seated on a thermoelectric cooler within the housing, and a laser mount is soldered to an upstream end of the optical bench. A laser substrate is secured to the laser mount, and a semiconductor laser is bonded to the laser substrate.

A graded index ("GRIN") lens for focusing the output from the laser is seated in a cylindrical trough formed in the optical bench, downstream from the laser. An optical isolator is provided downstream from the GRIN lens for reducing reflections of light toward the laser.

A precision capillary is secured to the optical bench downstream from the optical isolator and provides means for restricting lateral movement of an optical fiber within the module.

An optical fiber can be inserted through the precision capillary and secured to the housing at a point downstream from the precision capillary. The interior end of the optical fiber is unattached within the module, and thermal stresses on the fiber are, accordingly, reduced.

Alignment of the laser, GRIN lens, and optical fiber is achieved by adjusting the components' relative vertical, horizontal, and longitudinal positions so as to maximize light output through the optical fiber. Once aligned, the components are soldered or otherwise secured in place.

BRIEF DESCRIPTION OF DRAWINGS

These and other features and advantages will be appreciated as this invention becomes better understood by reference to the following detailed description when considered in connection with the accompanying drawings, wherein:

FIG. 1 is a transverse cross section of a laser module constructed according to principles of this invention;

FIG. 2 is a perspective view of an interior portion of the module;

FIG. 3 is a plan view of the module with the cover removed interior;

FIG. 4 is schematic view of a portion of the module showing the axes for alignment of the module's components; and FIG. 5 is a fragmentary perspective view of another embodiment of optical bench for the laser module.

DETAILED DESCRIPTION

A laser module is hermetically sealed in a grounded metal housing formed of a base 10, a rectangular ring or frame 11 forming the walls of the housing, and a cover 12. In an exemplary embodiment the base is made from sintered tungsten powder infiltrated with copper for high thermal conductivity and low thermal expansion coefficient. The frame is sliced from a hollow Kovar extrusion and preferably furnace brazed to the base. After the interior components are assembled, a Kovar cover is welded on the top of the ring or frame to form a hermetic seal.

A thermoelectric cooler 14 is soldered onto the module base 10. By passing an electric current through the thermoelectric cooler, the junction secured to the base can be heated (or cooled) while the opposite junction remote from the base is cooled (or heated). In use the module base may be connected to an externally heat sink for maintaining a substantially constant temperature.

An optical bench 16 is soldered onto the thermoelectric cooler. In an exemplary embodiment the optical bench is machined from a block of copper or aluminum, and has a distinctive U-shape consisting of a thick "upstream" portion 18, a thinner middle portion 20, and a narrow, vertical "downstream" portion 22.

A conventional thermistor 23 is bonded to the upstream portion of the optical bench. The thermistor, with its high change in resistivity as a function of temperature, is used for controlling the temperature of the optical bench by varying current through the thermoelectric cooler. Metallized leads (not shown) provide electrical connection to the thermistor.

A laser mount or mounting block 24 is soldered to one end of the upstream portion 18 of the optical bench. In an exemplary embodiment, the laser mount, like the optical bench, is machined from a block of copper or aluminum. Soldering is a preferred mode of attachment for high thermal conductivity through the joint.

A rectangular laser substrate 26 is soldered to the upper face 27 of the laser mount. A high thermal conductivity ceramic, such as beryllium oxide, is preferred for the laser substrate.

A semiconductor laser 28 is bonded onto the laser substrate near one edge. The laser is extremely small, typically measuring only 250 microns square and about 75 microns thick. The lasing junction of the laser diode is in a plane parallel to the plane of the substrate.

Preferably, a photodiode 29 is mounted on the laser substrate 26, upstream from the laser. The photodiode receives light from the back of the laser junction remote from the optical fiber. The resulting signal may be used for adjusting a laser diode bias current for obtaining a desired laser response.

A graded index ("GRIN") lens 30 having a diameter of about 1.8 millimeters is mounted on the optical bench 16, immediately downstream from the laser. The lens is preferably metallized about its perimeter so as to be wettable by solder, and is seated in a semi-cylindrical trough 31 formed in the upper surface of the upstream portion 18 of the optical bench. Because the index of refraction of the GRIN lens drops off as a function of distance from the lens' optical axis, the output of the laser becomes highly focused as it passes through the lens. Preferably, the upstream end 32 of the lens is convex in shape, and further focuses the laser's output.

Downstream from the GRIN lens, a conventional optical isolator 33 is mounted on the middle portion 20 of the optical bench. The optical isolator protects the laser 28 from light that would otherwise be reflected back toward the laser. The isolator typically passes back to the laser less than 0.1% of light incident upon the optical isolator from downstream sources. The isolator is skewed slightly from the optical axis of the bench for minimizing reflection from the isolator into the laser.

A precision capillary 34 is adhesively bonded, soldered, welded, or otherwise mounted on, the flat outer face 35 of the downstream portion 22 of the optical bench. In an exemplary embodiment the capillary is an aluminum oxide cylinder with an inner hole 36 126±0.5 microns in diameter. The outside diameter of the capillary tube is about a millimeter. It is secured in a metal sleeve which is bonded to the end of the optical bench. A slight conical lead-in 37 is formed at one end of the capillary to facilitate insertion of an optical fiber into the capillary. When an optical fiber 38 is inserted through the precision capillary and aligned with the laser and lens, the precision capillary acts as a guide and restricts movement of the fiber in a radial direction.

At the end of the housing opposite the laser, a tube 40, such as a Kovar tube, is brazed into the end of the frame 11, and provides means for guiding an optical fiber into the module and attaching the optical fiber to the module. More specifically, an optical fiber 38, is inserted through the tube 40 and the precision capillary 34. The perimeter of at least the upstream portion of the fiber seated in the tube 40 is metallized so as to be wettable by solder. Once the fiber is aligned, as described below, it is soldered into place at an inner joint 42 in the tube, and the protective sheath for the fiber (not shown) is further secured with an epoxy at an outer point 44 in the tube, downstream of the first joint. The solder at the inner joint forms a hermetic seal where the optical fiber enters the module.

In an exemplary embodiment the fiber is a conventional single mode fiber having a diameter of about 125 microns to fit tightly in the precision capillary with an inside diameter of 126 microns. Preferably, the upstream end of the fiber is oblique, in order to further minimize reflection of light back toward the laser. It will be apparent that multi-mode fibers can also be used with the present invention.

Although the module has been described as containing a laser, the present invention is not limited thereto. Other electro-optical transducers can also be provided in the module just described.

Additional elements such as electrical connectors for conveying electrical signals into the module, conductive leads and wires, laser bias circuitry, etc., can also be provided in the module and are of a conventional nature, such as described in U.S. Pat. No. 4,802,178 to Ury. In an exemplary embodiment of the invention, 14 leads provide means for connecting the module to external circuitry. To give an idea of scale to the laser module, the leads 45 illustrated in FIG. 3 along each side of the module are spaced 2.54 mm center to center.

Alignment of the laser, lens, and optical fiber is accomplished as follows. With the laser 28 bonded onto the laser substrate 26 which in turn is bonded onto the laser mount 24, and the GRIN lens 30 seated in, but not secured to, the trough 31 in the optical bench 16, the laser mount is moved, relative to the lens, in the horizontal and vertical directions until the output of the laser through the lens is maximized. As indicated in FIG. 4, the horizontal alignment axis is designated as the "X" axis, and the vertical axis is designated as the "Y" axis. In an exemplary embodiment the laser mount is moved along an X-Y plane defined by the interface between the abutting flat surfaces of the laser mount 24 and the optical bench 16. In other words, the position of the laser mount or mounting block is adjusted transversely relative to the optical axis of the optical bench. After the laser is aligned in its preferred X-Y position the laser mount is soldered into place at the end of the optical bench.

Once the relative horizontal and vertical positions of the laser and lens have been adjusted, the longitudinal distance between the lens 30 and the laser 28 is adjusted to maximize laser output through the lens, and to focus the laser output a selected point downstream from the optical isolator. To this end, the lens is moved along a "Z" axis defined by the trough's longitudinal axis. The Z-axis can be thought of as approximating the optical axis of the bench. Once aligned in its preferred position along axis, the lens s soldered into place.

In one embodiment of the invention, alignment of the laser and lens proceeds iteratively, with plural adjustments of the relative positions of the laser substrate and lens occurring before the substrate and lens are soldered into place. The final soldering of the lens and laser mount to the optical bench can be done simultaneously or sequentially. Further, a surrogate optical fiber may be used to facilitate measurement of laser output through the lens during the alignment process.

The precision capillary 34 is aligned with the optical axis by adjusting the capillary's position transversely relative to the optical bench 16. A surrogate fiber may be inserted into the precision capillary to facilitate alignment of the capillary. Thus, light output through a fiber inserted through the capillary is monitored as the x and y positions of the capillary are adjusted. Once the light maximizing position is located, the precision capillary is secured in place against the optical bench. That is, the abutting flat surfaces on the end of the optical bench and the upstream end of the precision capillary are attached to each other as described above. Thus, the laser module may be assembled and aligned as described, and then sold to an end user, who then inserts and aligns his own optical fiber in the module.

After the laser, lens and capillary have been aligned, and before the optical fiber 38 is secured to the tube 40, the fiber is aligned by adjusting both the distance between the upstream end of the fiber and the optical isolator, and by rotating the fiber which adjusts the angle of incidence of emitted light from the laser onto the slightly angled end of the fiber.

More specifically, the fiber is inserted through the precision capillary 34 until the end of the fiber is at a Z-axis position for maximum light output. Because of the fact that the face of the fiber is preferably oblique, maximum light output through the fiber is often achieved when the fiber's optical axis is slightly offset from the Z-axis. Thus, the fiber is rotated or otherwise manipulated until maximum light output therethrough is achieved. The fiber is then secured in place with solder as described above.

In the embodiment just described, the optical fiber is essentially cantilevered from the precision capillary for up to approximately one millimeter, so that the end of the fiber is at the focal point of the laser/lens system. When the length of the cantilevered section is just a few times the diameter of the fiber, it is essentially rigid. The end of the fiber may be flush with the end of the capillary or may even be recessed a small distance without occulting the light. It is preferable to have it extend beyond the end of the capillary for inspection and to assure that contamination does not enter a recessed opening to obscure the end of the fiber.

By fastening the fiber in just one location as described, thermal stress on the fiber is tremendously reduced. Although constrained in the x and y directions within the close confines of the precision capillary, the optical fiber can freely slide along the Z-axis in response to expansion and contraction brought about by temperature changes in the module. Because of the relatively small divergence of the focused beam, axial displacement of even ten microns from the focal point of the laser/lens system can occur without significant effect on the optical output of the module and fiber.

FIG. 5 illustrates another embodiment of optical bench suitable for practice of this invention. In this embodiment the precision capillary 34 is mounted in a block 48 having a bottom surface diagonal to the axis of the capillary. This diagonal surface rests on a ramp 49 on the optical bench. To adjust the capillary in the Y direction one moves the block along the ramp. This couples the Y and Z adjustments of the capillary, but that is of no consequence since the fiber is free to move in the Z direction in the capillary. The adjustment in the X direction is transverse to the slope of the ramp and is not coupled to either the Y or Z directions. The block is secured to the bench after adjustment by solder or an adhesive, or may be laser welded.

The ramp between the optical bench and the mounting block for the capillary provides greater sensitivity in adjustment in the Y direction than when the face of the capillary is secured normal to the optical axis of the bench. Also, the ramp provides a larger area for bonding of the capillary to the bench for greater strength. This is significant since there may be residual stress induced when the optical fiber is soldered in its ferrule. The fiber, small as it is, has appreciable stiffness in the small dimensions involved in the laser module. A lateral stress on the fiber from soldering may cause creep of the capillary mounting over long times. Having the larger area for bonding of the capillary to the bench reduces the likelihood of creep. Further, the mounting surface is at a favorable angle relative to any such stress, thereby largely obviating this as a potential problem for long term alignment of the module.

Another advantage of the combination of optical bench, laser mount and precision capillary lies in the ability to align the laser, lens and capillary using a surrogate fiber outside of the package. This not only simplifies assembly of the module and enables the use of laser welding techniques and the like, but also makes the internal subsystem readily adaptable to any of a variety of packages. It also makes it possible to ship and install the optical bench assembly without a troublesome fiber dangling from one end, with the fiber being inserted through the capillary by the user.

Further, by having the fiber rotatable within the capillary before it is sealed to the housing, one can readily adjust a polarization maintaining fiber relative to the polarization of the laser light.

The laser module converts electrical signals to correspondingly modulated light signals on the optical fiber. Frequency of the signal can range from DC up to many gigahertz. Similar principles may be used for a module where optical signals from an optical fiber are converted to electrical signals.

It should be recognized that the laser module is quite small. In an exemplary embodiment, the base 10 of the module, separate from its electrical connections, is less than three centimeters long and only thirteen millimeters wide.

Although but one embodiment of a laser module for modulation of an optical signal by an electrical signal has been described and illustrated herein, many modifications and variations will be apparent to one skilled in the art. For example, a super-luminescent diode ("SLD") can be used as the light source in place of the laser. Other electro-optical transducers can also be used. Other means in substitution for or in addition to the photodiode, thermistor and thermoelectric cooler can be provided for monitoring and control of the laser module. Although soldering the laser mount to the optical bench and soldering the precision capillary to the bench have been described, it will be apparent that laser or electron beam welding or other permanent attachment techniques may be used. More fundamentally, a device for converting optical signals into electrical signals (i.e. an opto-electrical transducer) can be housed within a module of the above-described sort. It is, therefore, to be understood that within the scope of the appended claims, the invention may be practiced otherwise than as specifically described.

What is claimed is:

1. A module for conversion between electrical signals and optical signals comprising:
   an optical bench having an optical axis;
   a mounting block at one end of the optical bench;
   a device for converting between electrical and optical signals on the mounting block;
   means for adjusting the position of the mounting block transverse to the optical axis for aligning the device with the optical axis and fixing the mounting block in position relative to the optical bench;
   a precision capillary at the other end of the optical bench; and
   means for adjusting the position of the precision capillary transverse to the optical axis for aligning the capillary with the optical axis and fixing the capillary in position relative to the optical bench.

2. A module as recited in claim 1 wherein the device comprises a laser for converting modulated electrical signals into optical signals.

3. A module as recited in claim 2 further comprising a lens mounted on the optical axis of the optical bench and means for longitudinally adjusting the position of the lens along the optical axis for focusing light from the laser and fixing the lens in position relative to the optical bench.

4. A module as recited in claim 3 wherein the means for adjusting the position of the lens comprises a trough parallel to the optical axis and means for permanently securing the lens to the bench at a selected location along the length of the trough.

5. A module as recited in claim 2 wherein the means for adjusting the position of the mounting block comprises abutting surfaces on the end of the bench and the end of the mounting block and means for permanently securing the mounting block onto the bench when the laser is aligned with the optical axis.

6. A module as recited in claim 1 wherein the means for fixing the position of the capillary comprises abutting surfaces on the bench and the capillary and means for permanently securing the capillary onto the bench when the capillary is aligned with the optical axis.

7. A module as recited in claim 6 wherein the abutting surfaces on the bench and the capillary are normal to the optical axis.

8. A module as recited in claim 6 wherein the abutting surfaces on the bench and the capillary are at a diagonal to the optical axis.

9. A module as recited in claim 1 wherein the module is sealed in a housing.

10. A module as recited in claim 9 further comprising means for sealing to the housing the perimeter of an optical fiber extending freely through the precision capillary.

11. A module as recited in claim 10 wherein the means for sealing comprises a tube extending from the housing and solder securing the fiber to the tube.

12. A module for aligning an optical fiber with an electro-optical transducer comprising:
a housing;
an optical bench mounted in the housing;
an electro-optical transducer mounted within the housing on the optical axis of the optical bench;
a precision capillary secured on an end of the optical bench in alignment with the optical axis of the optical bench;
an optical fiber; and
means for sealing the perimeter of the optical fiber to the housing with one end of the fiber extending freely through the capillary and the other end of the fiber external to the housing.

13. A module as recited in claim 12 wherein the transducer is a laser.

14. A module as recited in claim 13, further comprising means for fixing the laser in optical alignment with the fiber.

15. A module as recited in claim 12 wherein the optical fiber terminates in an oblique end within the module.

16. A semiconductor laser module comprising:
a housing;
a laser substrate in the housing;
a semiconductor laser mounted on the laser substrate;
an lens downstream from the laser;
an optical isolator downstream from the lens; and
a precision capillary for holding an optical fiber downstream from the optical isolator.

17. A module as recited in claim 16 wherein the lens is secured to an optical bench in the housing.

18. A module as recited in claim 17 wherein the optical bench has a trough aligned between the laser substrate and the precision capillary, formed therein for receiving the lens and providing means for longitudinal adjustment of the lens.

19. A module as recited in claim 16 further comprising an optical fiber extending through the precision capillary.

20. A module as recited in claim 17 wherein the optical fiber terminates in an oblique end within the module.

21. A module as recited in claim 16 further comprising means for both guiding an optical fiber into the module and attaching the fiber to the module, said means comprising a tube extending from a downstream end of the housing.

22. A laser module comprising:
a housing;
a thermoelectric cooler mounted in the housing;
an optical bench mounted on the thermoelectric cooler;
a thermistor mounted on the optical bench and connected to the thermoelectric cooler for control thereof;
a laser mount attached to one end of the optical bench;
a laser substrate soldered to an upper face of the laser mount;
a laser diode bonded onto one edge of the laser substrate;
a GRIN lens seated in a trough formed in the optical bench, downstream from the laser diode;
an optical isolator mounted on the optical bench, downstream from the GRIN lens;
a precision capillary for restricting radial movement of an optical fiber within the module, secured to the optical bench downstream from the optical isolator; and
means on the housing for sealing an optical fiber to the housing with an end extending through the capillary.

23. A laser module as recited in claim 22, further comprising an optical fiber extending through the precision capillary and having an end portion cantilevered from the capillary.

24. A laser module as recited in claim 23 wherein the optical fiber terminates in an oblique end within the module.

* * * * *

UNITED STATES PATENT AND TRADEMARK OFFICE
CERTIFICATE OF CORRECTION

PATENT NO.  : 5,127,072

DATED       : June 30, 1992

INVENTOR(S) : Henry A. Blauvelt; Sze-Keung Kwong; Ching-Jong Lii; Ronald S. Moeller; Israel Ury It is certified that error appears in the above-identified patent and that said Letters Patent is hereby corrected as shown below:

Column 1, line 36, after "diode" change "without" to -- within --.

Column 2, line 15, before "interior" insert -- to show the --.

Column 3, line 37, change "126+0.5" to -- 126±0.5 --.

Column 4, line 44, change "axis" to -- Z-axis --.

Column 4, line 44, after "lens" change "s" to -- is --.

Column 7, line 22, change "fixing" to -- adjusting --.

UNITED STATES PATENT AND TRADEMARK OFFICE
CERTIFICATE OF CORRECTION

PATENT NO. : 5,127,072

DATED : June 30, 1992

INVENTOR(S) : Henry A. Blauvelt; Sze-Keung Kwong: Ching-Jong Lii; Ronald S. Moeller; Israel Ury It is certified that error appears in the above-identified patent and that said Letters Patent is hereby corrected as shown below:

Column 8, line 7, before "lens" change "an" to --a--.

Signed and Sealed this

Tenth Day of August, 1993

Attest:

MICHAEL K. KIRK

*Attesting Officer*     *Acting Commissioner of Patents and Trademarks*